(12) United States Patent
Harada et al.

(10) Patent No.: US 6,876,273 B2
(45) Date of Patent: Apr. 5, 2005

(54) FRONT END MODULE

(75) Inventors: Nobumi Harada, Tokyo (JP); Satoshi Suga, Tokyo (JP); Masashi Iwata, Tokyo (JP); Hideki Hasegawa, Tokyo (JP); Hiroshi Tadanoh, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/143,926

(22) Filed: May 14, 2002

(65) Prior Publication Data

US 2002/0171508 A1 Nov. 21, 2002

(30) Foreign Application Priority Data

May 15, 2001 (JP) .......................................... 2001-145301

(51) Int. Cl.[7] .............................................. H01L 41/00
(52) U.S. Cl. ........................................ 333/133; 333/193
(58) Field of Search ................................. 333/133, 193, 333/194, 195, 196, 173

(56) References Cited

U.S. PATENT DOCUMENTS

| | | | | |
|---|---|---|---|---|
| 5,854,579 A | * | 12/1998 | Penunuri | 333/193 |
| 5,994,980 A | * | 11/1999 | Tada | 333/193 |
| 6,025,761 A | * | 2/2000 | Watanabe et al. | 333/133 |
| 6,060,960 A | | 5/2000 | Tanaka et al. | |
| 6,249,194 B1 | * | 6/2001 | Watanabe et al. | 333/133 |
| 6,397,044 B1 | * | 5/2002 | Nash et al. | 455/73 |
| 6,531,933 B2 | * | 3/2003 | Miyamoto et al. | 333/133 |
| 6,606,015 B2 | * | 8/2003 | Uriu et al. | 333/132 |

FOREIGN PATENT DOCUMENTS

| | | |
|---|---|---|
| JP | 7-99420 | 4/1995 |
| JP | 7-283496 | 10/1995 |
| JP | 8-97743 | 4/1996 |
| JP | 10-32521 | 2/1998 |
| JP | 10-145270 | 5/1998 |
| JP | 2000-114917 | 4/2000 |

OTHER PUBLICATIONS

Patent Abstracts of Japan, JP 2000-077969, Mar. 14, 2000.
Patent Abstracts of Japan, JP 2000-244337, Sep. 8, 2000.
Patent Abstracts of Japan, JP 2000-236227, Aug. 29, 2000.
Patent Abstracts of Japan, JP 2001-127663, May 11, 2001.
Patent Abstracts of Japan, JP 2001-060839, Mar. 6, 2001.
Patent Abstracts of Japan, JP 10-242888, Sep. 11, 1998.
Patent Abstracts of Japan, JP 2002-171198, Jun. 14, 2002.
Patent Abstracts of Japan, JP 2002-261651, Sep. 13, 2002.

* cited by examiner

Primary Examiner—Michael Tokar
Assistant Examiner—Linh V Nguyen
(74) Attorney, Agent, or Firm—Oblon, Spivak, McClelland, Maier & Neustadt, P.C.

(57) ABSTRACT

Such a front end module is arranged as a module using an antenna switch (6), a low pass filter (5), a surface acoustic wave filter (7) and a balun (8) integrated by a multilayer substrate (11) and components incorporated in or mounted on the multilayer substrate (11).

6 Claims, 5 Drawing Sheets

FRONT END MODULE

BACKGROUND OF THE INVENTION

The present invention relates to a front end module mainly including an antenna switch available to mobile communications apparatus such as a cell phone and an automobile phone.

A high frequency circuit of related art mobile communications apparatus includes an antenna switch or selectively connecting an antenna to a transmitter circuit or a receiver circuit, a surface acoustic wave filter (hereinafter referred to as a SAW filter) as a band-pass filter for filtering a signal received via the antenna switch and an amplifier circuit for amplifying a received signal that has passed the filter.

The internal circuit of an analog IC used in the amplifier circuit of a receiver circuit generally includes a differential amplifier circuit. The input terminal of an analog IC is usually of a balanced system for input a received signal as a potential difference between two terminals. Thus, it is desirable to use a balanced SAW filter as the SAW filter.

However, it is difficult to provide a good balance to obtain sufficient characteristics in a balanced SAW filter. This is because a more minute pattern design is required as the frequency band used gets higher and sensitivity to a line length becomes higher as the frequency elevates, that is, it is difficult to provide good balance characteristics in a SAW filter used in a higher frequency. Therefore, a common practice is to use an unbalanced-output SAW filter and a balanced-to-unbalanced line transformer (called a balun) is provided between the SAW filter and an amplifier circuit in order to convert an unbalanced signal to a balanced signal. This is because a balun does not require a very high element sensitivity and it is relatively easy to provide a good balance. In this case, an impedance across balanced input terminals of the analog IC in the receiver circuit is determined per IC so that the balun used conforms to the particular impedance. The Japanese Patent Publication No. Hei. 10-32521 discloses a front end module including a multilayer substrate and a surface-mounted components, the front end module incorporating a SAW filter.

As described in the Japanese Patent Publication No. Hei. 10-32521, in a front end module that incorporates a SAW filter on a multilayer substrate, the output impedance is determined by the characteristics of the incorporated SAW filter. Thus, a SAW filter of a desired impedance is essential to the front end module.

In case an unbalanced SAW filter is used, the user must provide a balun between the receiving IC and a front end module.

Using a different SAW filter each time the impedance is changed requires a matching design of the entire front end module. This needs the corresponding time.

SUMMARY OF THE INVENTION

The invention, in view of the above problems, aims at providing a front end module wherein impedance matching to a receiver circuit external to the front end module is made easy and wherein the number of components and mounting area on a printed circuit board that mounts the front end module are reduced thus downsizing a mobile communications apparatus.

A front end module according to the first aspect of the invention includes an antenna switch for selectively connecting an antenna to a transmitter circuit or a receiver circuit, a low pass filter for removing harmonics from a transmit signal output from a transmitter circuit, an unbalanced-output surface acoustic wave filter for filtering a signal received via the antenna switch of the antenna, a balun for converting an unbalanced signal that has passed through the surface acoustic wave filter, wherein the antenna switch, the low pass filter, the surface acoustic wave filter and the balun are arranged as a module integrated using a multilayer substrate and components incorporated in or mounted on the multilayer substrate.

The front end module according to the second aspect of the invention, the front end module is used for mobile communications apparatus used in different communications systems.

According to the invention, it is easy to adjust the output impedance of a front end module to the input impedance of a receiver circuit by changing the characteristics of a balun provided in the front end module. Matching between elements other than the balun is not required so that it is possible to tailor a front end module easily and promptly to a design change of a receiver circuit.

An impedance matching circuit between a SAW filter and a balun may be omitted by mounting/incorporating the balun on/in a front end module thus it is not necessary to externally provide matching components. This reduces the number of components and mounting area on a printed circuit board that mounts the front end module thereby downsizing a mobile communications apparatus.

A SAW filter is an element with extremely large phase variations in the applicable band so that the impedance matching design is made difficult. Thus a balun is used to provide matching. A balun on the market is designed to an input impedance of a bet resistance of 50 ohms. A combination of such baluns is difficult to provide complete matching of impedance. In case a balun is incorporated in a multilayer substrate, it is possible to form a balun within the substrate that matches the output impedance of the SAW filter thus allowing complete impedance matching and reducing the insertion loss.

DETAILED DESCRIPTION OF THE PREFERRED EMBODIMENT

Figure 1A:
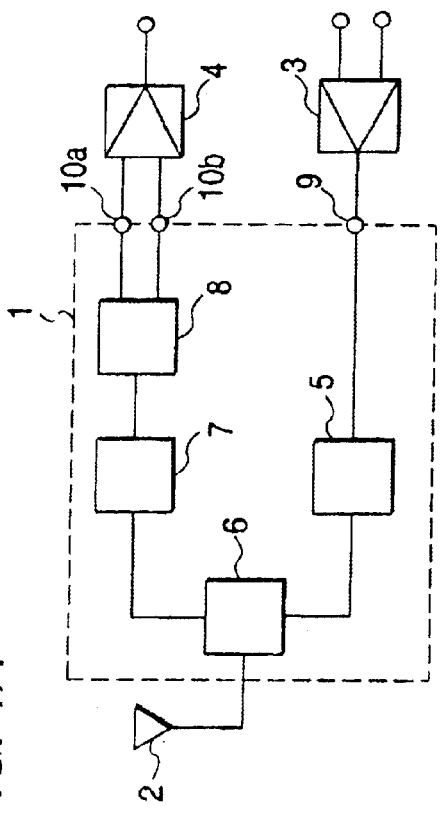
FIG. 1A is a block diagram showing is a block diagram showing a front end module according to an embodiment of the invention.

The embodiments of the invention will be described referring to drawings. FIG. 1A is a block diagram showing a front end module according to an embodiment of the invention. In FIG. 1A, a section 1 enclosed by dotted lines is a front end module, a numeral 2 represents an antenna, 3 represents an amplifier circuit in the transmitter circuit, 4 represents an amplifier circuit in the receiver circuit, 5 represents a low pass filter for removing harmonics generated in the amplifier circuit 3, 6 represents an antenna switch for selecting between transmission and reception, 7 represents a SAW filter provided as a band pass filter, and 8 represents a balun. A numeral 9 represents a port connected to the amplifier circuit 3 of the transmitter circuit, 10a and 10b represent ports connected to the amplifier circuit 4 of the receiver circuit.

Figure 1B:
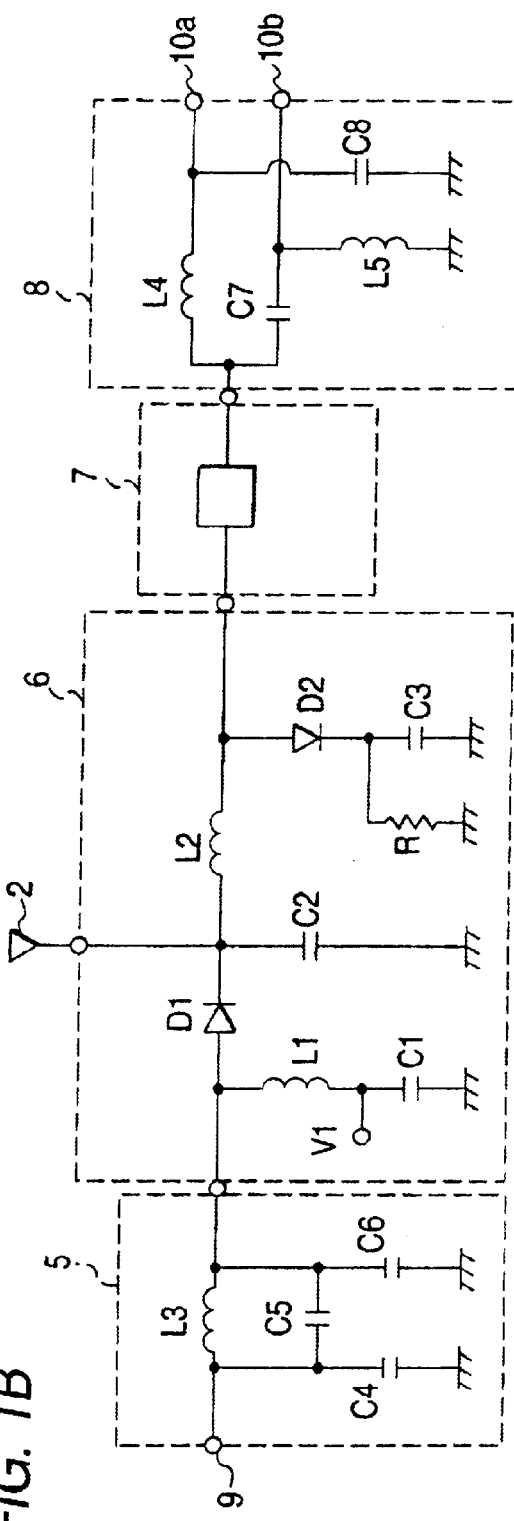
FIG. 1B is a circuit diagram of the front end module shown in FIG. 1A.

FIG. 1B is a circuit diagram of the front end module 1. In the figure, numerals 5 through 9, 10a, 10b are components shown in FIG. 1A. C1 through C8 represent capacitors, D1 and D2 represent diodes, L1 through L5 represent inductors, R represents a resistor, and V1 represents a control terminal for applying a control signal for switching between transmission and reception. These elements and ports are interconnected as shown in the figure. The balun 8 includes inductors L4 and L5 and capacitors C7 and C8 and obtains signals with a phase difference of 180 degrees between the ports 10a and 10b.

Figure 2A:
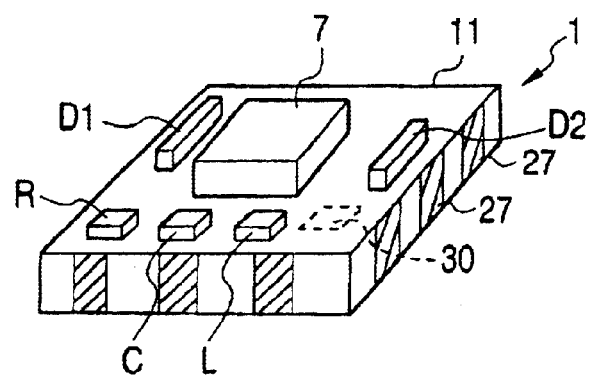
FIG. 2A shows an external view of a front end module according to this embodiment.
Figure 2B:
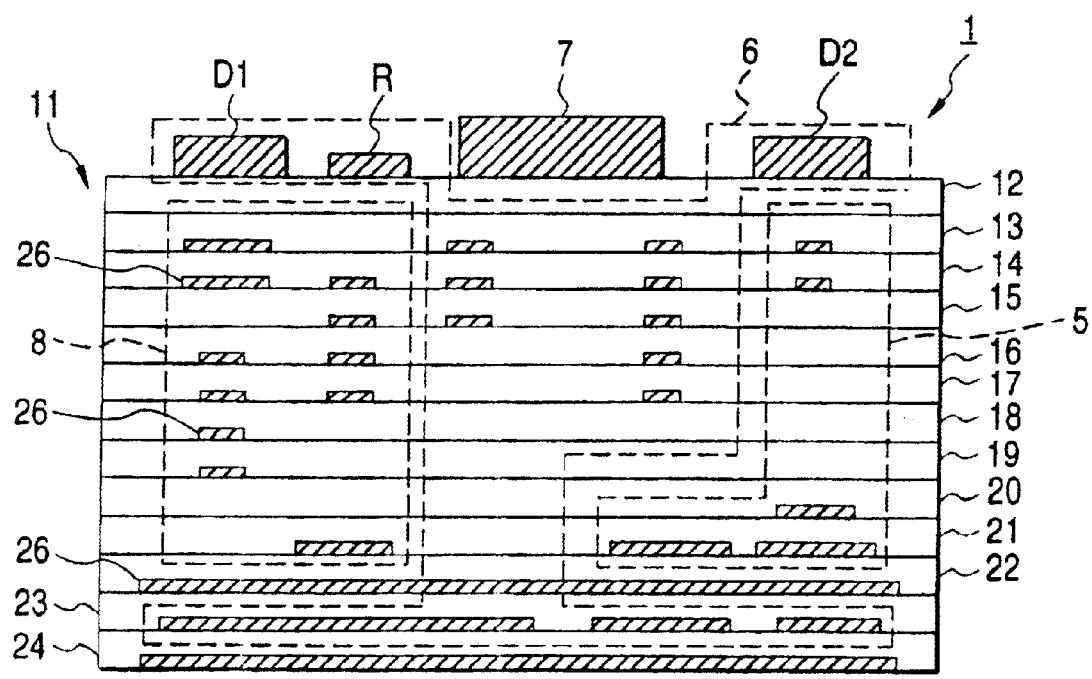
FIG. 2B shows a layered structure of the front end module in FIG. 2A.

FIG. 2A is a perspective view showing the external view of a front end module according to the embodiment. FIG. 2B shows a layered structure of the front end module in FIG. 2A. A numeral 11 represents a multilayer substrate constituting the front end module and has a layered structure including an insulator layer (including ones having a resistance value called semiconductors) 12 through 24 including a ceramic dielectric or ceramic magnetic substance, or a resin, or a compound material where a resin is mixed with ceramic magnetic powder or dielectric powder, and a conductor layer 26 for arranging capacitors and inductors.

In case the multilayer substrate is made of a ceramic dielectric material, a conductive paste mainly composed of silver is printed in predetermined pattern in a ceramic green sheet, and such green sheets are simultaneously layered and fired. Conductive patterns printed on the green sheets are interconnected by way of through-hole conductors.

In case a resin or a compound material is used, a resin substrate or a compound material substrate where a conductor pattern is formed by for example a copper-film or thin-film patterning and a pre-preg are alternately layered to set the pre-preg in order to fabricate a multilayer substrate.

As shown in FIG. 2A, on the side face of the multilayer substrate 11 is provided terminal electrodes 27. These terminal electrodes 27 maybe used for external connection (for the ports 9, 10 and control terminal V1) or connection of elements incorporated in a front end module or connection of a built-in element and a surface-mounted element. The terminal electrodes 27 is soldered to a printed circuit board.

In FIG. 2A, L, C among surface-mounted electronic components represents an inductor with high inductance or a capacitor with a high capacitance value out of the inductors L1 through L5 and capacitors C1 through C8. Of the surface-mounted components, R represents a resistor, D1 and D2 represent diodes, 7 represents a SAW filter, all of which are incorporated in the circuit shown in FIG. 1B.

In FIG. 2B, a numeral 5 represents the low pass filter, 6 represents an antenna switch, and 8 represents a balun. As shown in the figure, in this exemplary embodiment, the low pass filter 5 has built-in elements only, the antenna switch 6 includes built-in elements and surface-mounted components, and the balun 8 includes built-in elements.

In this way, in case the balun 8 is provided in the front end module 1, it is possible to easily adjust the balance of signals output from the ports 10a, 10b by changing the characteristics of the inductors L4, L5 or capacitors C7, C8 as components of the balun. It is also possible to easily adjust the output impedance to the input impedance of the receiver circuit 4, thereby tailoring a front end module easily and promptly to a design change of a receiver circuit. For example, in case the balun 8 is arranged as shown in the circuit configuration of FIG. 1B, arranging capacitor C7 closer to the GND layer generates a capacitance connected to GND. This worsens the characteristics of C7. Thus C7 is arranged in this example possibly apart from the GND layer.

In FIG. 2B, the SAW filter 7 as well as the balun 8 are included in a front end module. This omits an impedance matching circuit between the SAW filter 7 and the balun 8. As a result, the size of the front end module is not substantially increased and the balun 8 is not required externally. This reduces the number of components and mounting area on a printed circuit board thereby downsizing a mobile communications apparatus.

Figure 3A:
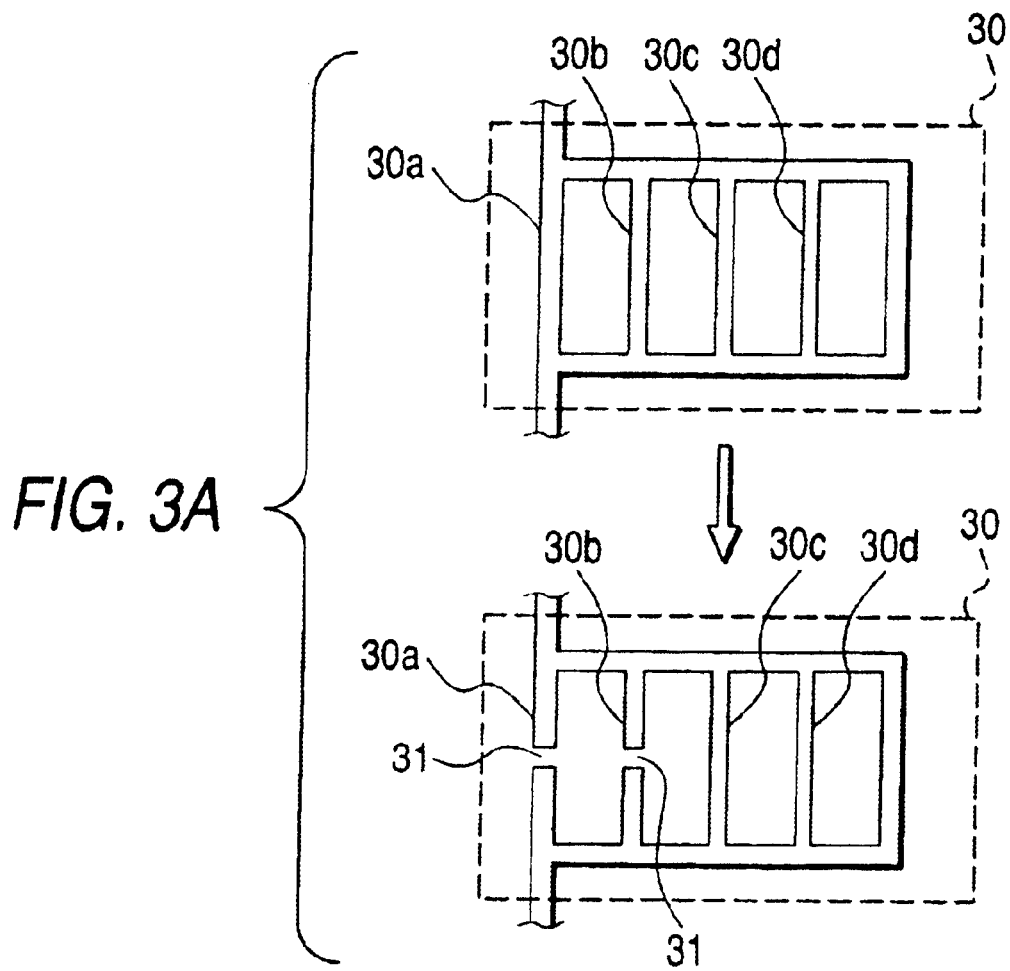
FIG. 3A is a plan view showing a conductive inductor for adjusting a balun in the embodiment.

In FIG. 2A, a numeral 30 represents a conductive inductor formed on the surface of the multilayer substrate 11 and used for adjusting the balance or impedance of the balun 8. FIG. 3A shows its specific example. In this example, the conductive inductor is arranged as part of both or one of the conductive inductors constituting part of one of the inductors L4 and L5 of the balun 8. The conductive inductor 30 is formed in ladder shape. A plurality of adjusting sections 30a through 30d are broken with laser (31 shows a broken section) to adjust the inductance thereby adjusting the balance or impedance.

With such adjusting means, it is possible to adjust the balance and impedance as well as apply a front end module of the same design to a plurality of models. Such adjusting means may be arranged to adjust the capacitance of a capacitor on top of adjustment of the inductor.

Figure 3B:
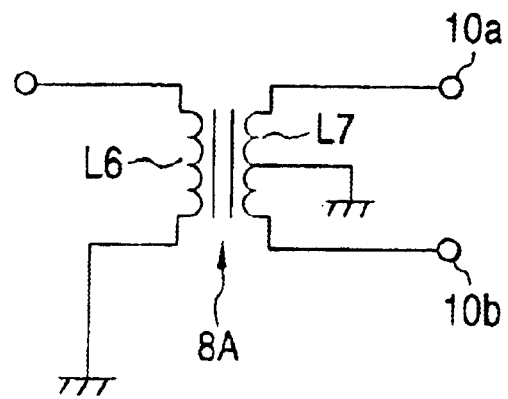
FIG. 3B is s circuit diagram showing another example of a balun in this example.

FIG. 3B is another configuration example of a balun. The balun 8A in this figure is a magnetic coupling or a preliminary coil L6 and a secondary coil L7 with intermediate section grounded, wherein a phase difference of 180 degrees is obtained from the ports 10a, 10b of the secondary coil L7.

While single band system mobile communications apparatus is described in the foregoing embodiment, the invention may be applied to mobile communications apparatus used in a dual band system (for example the GSM system using the approximately 900 MHz band and the DCS system using the approximately 1800 MHz band), or a triple band system (for example the GSM system and the DCS system as well as the PCS system using the approximately 1900 MHz band).

Figure 4A:
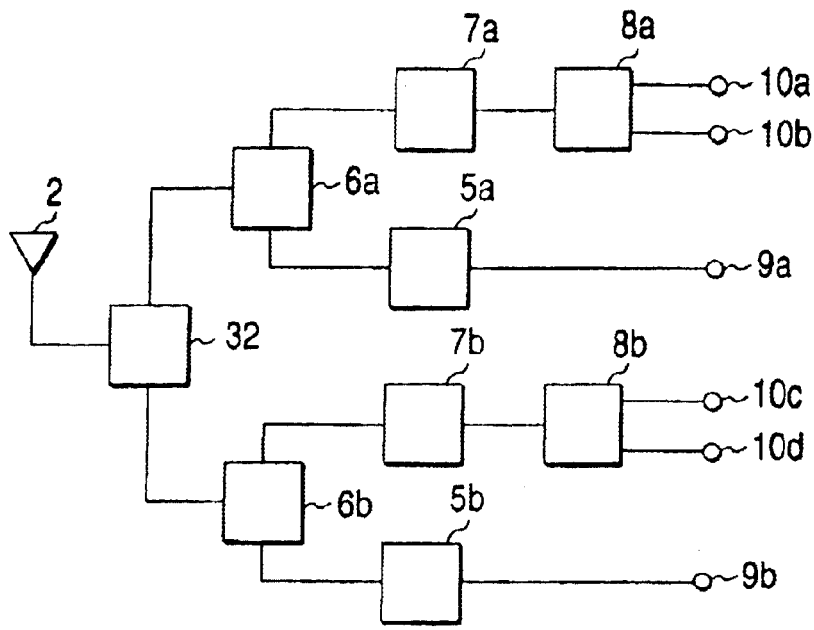
FIG. 4A is a block diagram showing another embodiment of a front end module.

In FIG. 4A, a numeral 32 shows a diplexer, 5a, 5b represents a GSM or DCS low pass filter respectively, 6a, 6b represents a GSM or DCS antenna switch respectively, 7a, 7b represents a SAW filter for GSM or DCS respectively, 8s, 8b represents a balun for GSM or DCS respectively, 9a, 9b represents a transmitter circuit connection port for GSM or DCS respectively, and 10a, 10b and 10c, 10d represent receiver circuit connection ports for GSM or DCS respectively. These elements from the diplexer 32 to the ports 9a, 9b, and 10a through 10d are included in a single front end module.

Figure 4B:
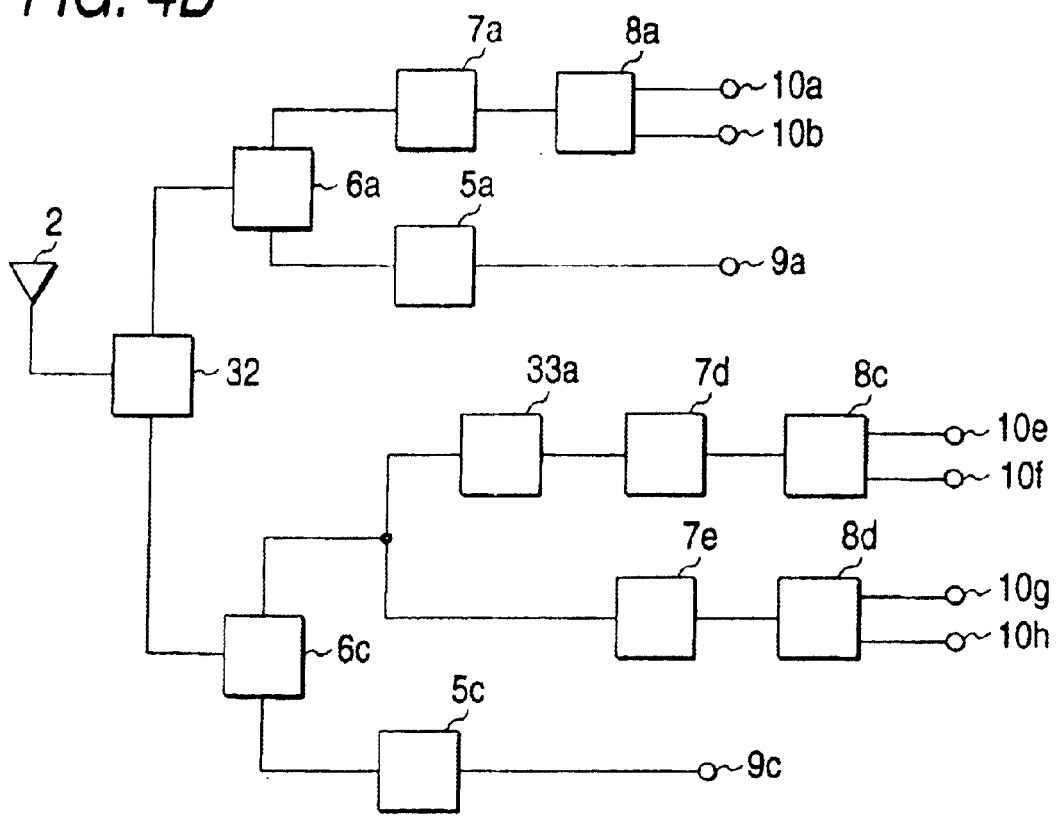
FIG. 4B is a block diagram showing another embodiment of a front end module.

In FIG. 4B, the GSM system section is the same as the FIG. 4A. A numeral 5c represents a low pass filter for both DCS and PCS, 6c represents an antenna switch for both DCS and PCS, 33a represents a phase shift circuit, 7d, 7e represents a SAW filter for dividing a received signal per DCS or PCS respectively, 8c, 8d represents a balun for DCS or PCS. The phase shift circuit 33a, is provided to keep the PCS band (DCS band) on the DCS side (PCS side) at high impedance in order to prevent passage of an out-of-band signal in the SAW filter 7d (7e) where the input impedance is low, thereby allowing frequency separation. A numeral 9c represents a port for transmitter circuit connection port for both DCS and PCS, 10e, 10f, and 10g, 10h represent receiver circuit connection ports for both DCS and PCS.

In this embodiment also, the elements from the diplexer 32 to the ports 9a, 9b, 10a, and 10e through 10h are included in a single front end module.

Figure 5:
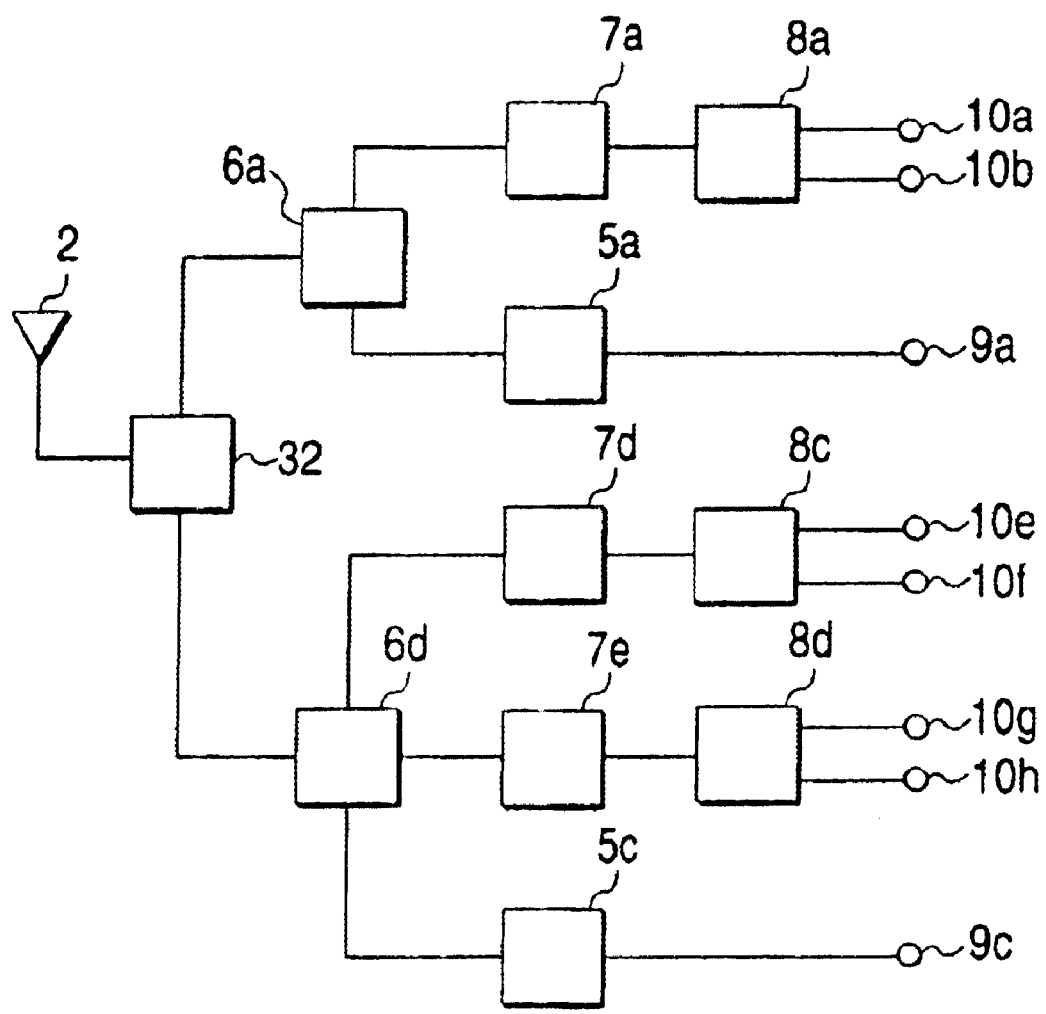
FIG. 5 is a block diagram showing another embodiment of a front end module.

In the embodiment of FIG. 5, an antenna switch 6d has a feature to switch between a DCS signal and a PCS signal as a receive signal. Thus, the phase shift circuit 33a is omitted. The other configuration is the same as that of the example in FIG. 4B. In this embodiment also, the elements from the diplexer 32 to the ports 9a, 9c, 10a, and 10e through 10h are included in a single front end module.

In any of the examples in FIGS. 4A, 4B and 5, including a SAW filter and a balun in a front end module has the same advantage as the mobile communications apparatus of the single band system.

The SAW filter 7 maybe incorporated in a front end module. The SAW filter may be incorporated or mounted as a discrete component as well as a bare chip. In case the SAW filter 7 as a bare chip is mounted on the surface of the multilayer substrate 11, a resin mold or case is used to cover the SAW filter 7.

According to the invention, an antenna switch, a low pass filter, a surface acoustic wave filter and a balun are arranged as a module integrated using a multilayer substrate and components incorporated in or mounted on the multilayer substrate. Thus it is possible to adjust the output impedance of a front end module to the input impedance of a receiver circuit by changing the characteristics of a balun provided in the front end module. This makes it possible to tailor a front end module easily and promptly to a design change of a receiver circuit.

An impedance matching circuit between a SAW filter and a balun may be omitted because a balun is included in a front end module. As a result, the size of the front end module is not substantially increased and the balun is not required externally. This reduces the number of components and mounting area on a printed circuit board thereby downsizing a mobile communications apparatus.

What is claimed is:

1. A front end module comprising:
   an antenna switch for selectively connecting an antenna to a transmitter circuit or a receiver circuit;
   a low pass filter for removing harmonics from a transmit signal output from a transmitter circuit;
   an unbalanced-output surface acoustic wave filter for filtering a signal received via said antenna switch of said antenna; and
   a balun for converting an unbalanced signal that has passed through said surface acoustic wave filter,
   wherein said antenna switch, said low pass filter, said surface acoustic wave filter and said balun are arranged as a module integrated by a multilayer substrate and components incorporated in or mounted on said multilayer substrate and
   wherein said antenna switch, said surface acoustic wave, and said balun are connected in this order along a flow of received signal, and said surface acoustic wave and said balun are directly connected.

2. The front end module according to claim 1, wherein said front end module is used for mobile communications apparatus used in a plurality of different communications systems.

3. The front end module according to claim 1, wherein the surface acoustic wave has one output terminal and one input terminal.

4. The front end module according to claim 1, wherein the balun comprises a multiplayer-structured inductance and a multiplayer-structured inductance condenser inside the multilayer substrate.

5. The front end module according to claim 3, wherein said front end module is used for mobile communications apparatus used in a plurality of different communications systems.

6. The front end module according to claim 4, wherein said front end module is used for mobile communications apparatus used in a plurality of different communications systems.

* * * * *